(12) United States Patent
Park et al.

(10) Patent No.: US 8,867,283 B2
(45) Date of Patent: Oct. 21, 2014

(54) SEMICONDUCTOR MEMORY DEVICE, OPERATING METHOD THEREOF, AND DATA STORAGE APPARATUS INCLUDING THE SAME

(75) Inventors: Won Sun Park, Icheon-si (KR); Tae Ho Jeon, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 217 days.

(21) Appl. No.: 13/469,847

(22) Filed: May 11, 2012

(65) Prior Publication Data

US 2013/0121090 A1   May 16, 2013

(30) Foreign Application Priority Data

Nov. 14, 2011   (KR) .................. 10-2011-0118071

(51) Int. Cl.
*G11C 7/22*   (2006.01)
*G11C 7/10*   (2006.01)
*G11C 7/00*   (2006.01)

(52) U.S. Cl.
CPC .. *G11C 7/10* (2013.01); *G11C 7/22* (2013.01); *G11C 7/00* (2013.01); *G11C 7/1006* (2013.01); *G11C 7/1012* (2013.01)
USPC ............. 365/189.14; 365/189.15; 365/189.16

(58) Field of Classification Search
CPC .......... G11C 16/30; G11C 5/147; G11C 7/04; G11C 7/10; G11C 7/22; G11C 7/00; G11C 7/1012; G11C 7/1006

USPC ..................... 365/189.14, 189.15, 189.16
See application file for complete search history.

(56) References Cited

U.S. PATENT DOCUMENTS

| 2011/0119432 | A1* | 5/2011 | Yoon ............................. 711/103 |
| 2012/0166714 | A1* | 6/2012 | Mun et al. ..................... 711/103 |
| 2012/0239861 | A1* | 9/2012 | Lee et al. ...................... 711/103 |
| 2012/0265928 | A1* | 10/2012 | Mun et al. ..................... 711/103 |
| 2012/0287719 | A1* | 11/2012 | Mun et al. ................. 365/185.18 |

FOREIGN PATENT DOCUMENTS

KR   1020100111990 A   10/2010

* cited by examiner

*Primary Examiner* — Pho M Luu
(74) *Attorney, Agent, or Firm* — William Park & Associates Patent Ltd.

(57) ABSTRACT

A semiconductor memory device includes memory cells arranged at regions where word lines and bit lines cross each other; a randomizing and de-randomizing circuit configured to perform a first randomizing operation on data to be programmed to the memory cells, based on a seed value, so as to generate first randomized data; a data reading/writing circuit configured to perform a second randomizing operation on the first randomized data using a data inverting operation so as to generate second randomized data and program the second randomized data to the memory cells; and a control logic configured to control the randomizing and de-randomizing circuit and the data reading/writing circuit.

20 Claims, 11 Drawing Sheets

FIG.4

| | ABh | | | | | | | | CAh | | | | | | | | ... |
|---|---|---|---|---|---|---|---|---|---|---|---|---|---|---|---|---|---|
| RDM(1) | b7 | b6 | b5 | b4 | b3 | b2 | b1 | b0 | b7 | b6 | b5 | b4 | b3 | b2 | b1 | b0 | ... |
| | 1 | 0 | 1 | 0 | 1 | 0 | 1 | 1 | 1 | 1 | 0 | 0 | 1 | 0 | 1 | 0 | |

⇓ 2nd randomizing operation

| | AAh | | | | | | | | CBh | | | | | | | | ... |
|---|---|---|---|---|---|---|---|---|---|---|---|---|---|---|---|---|---|
| RDM(2) | b7 | b6 | b5 | b4 | b3 | b2 | b1 | b0 | b7 | b6 | b5 | b4 | b3 | b2 | b1 | b0 | ... |
| | 1 | 0 | 1 | 0 | 1 | 0 | 1 | 0 | 1 | 1 | 0 | 0 | 1 | 0 | 1 | 1 | |

SEMICONDUCTOR MEMORY DEVICE, OPERATING METHOD THEREOF, AND DATA STORAGE APPARATUS INCLUDING THE SAME

CROSS-REFERENCES TO RELATED APPLICATION

The present application claims priority under 35 U.S.C. §119(a) to Korean application number 10-2011-0118071, filed on Nov. 14, 2011, in the Korean Intellectual Property Office, which is incorporated herein by reference in its entirety.

BACKGROUND

1. Technical Field

The present invention relates generally to a semiconductor memory device, and more particularly to a randomizing and de-randomizing operation method of a semiconductor memory device.

2. Related Art

Semiconductor memory devices are generally divided into a volatile memory device and a nonvolatile memory device. While the volatile memory device loses stored data when power supply is interrupted or switched off, the nonvolatile memory device can retain stored data even in absence of power supply. Nonvolatile memory devices include various types of memory cell transistors. Nonvolatile memory devices are divided into a flash memory device, a ferroelectric RAM (FRAM), a magnetic RAM (MRAM), and a phase change RAM (PRAM).

Among nonvolatile memory devices, flash memory devices are generally divided into a NOR flash memory device and a NAND flash memory device, depending upon the configuration of memory cells and bit lines. The NOR flash memory device has a structure in which two or more memory cell transistors are connected in parallel to one bit line. Accordingly, the NOR flash memory device has an excellent characteristic in terms of random access time. Conversely, the NAND flash memory device has a structure in which two or more memory cell transistors are connected in series to one bit line. This structure is referred to as a cell string structure, and requires only one bit line contact per a cell string. Therefore, the NAND flash memory device has an excellent characteristic in terms of the degree of integration.

The semiconductor memory device such as a flash memory device may have various cell states such as ON cells and OFF cells depending upon a threshold voltage distribution. The ON cells may be erased cells, and the OFF cells may be programmed cells. The threshold voltage of a programmed memory cell may be changed by various factors. For example, the threshold voltage of the programmed memory cell may be changed due to program disturbance or coupling between adjacent memory cells. This will be described in detail below.

For instance, in a program operation, a change in the threshold voltage of a selected memory cell depending upon programmed data may cause changes in the threshold voltages of the adjacent memory cells. Also, in a read operation, cell current flowing through a selected memory cell may vary depending upon the threshold voltages of adjacent memory cells. In other words, the threshold voltage of a memory cell may be changed depending upon data programmed in a selected memory cell or a data pattern which means the threshold voltage distributions of adjacent memory cells.

The influence by the program disturbance or the coupling between memory cells may vary depending upon a data pattern. Therefore, in order to reduce variations in the threshold voltages of memory cells, a flash memory device may perform a randomizing operation for input data and perform a de-randomizing operation for data stored in memory cells.

SUMMARY

A semiconductor memory device with improved reliability, a randomizing and de-randomizing operation method thereof, and a data storage apparatus including the same are described herein.

In an embodiment of the present invention, a nonvolatile memory device includes: a memory cell disposed at a region where a word line and a bit lines cross with each other; a randomizing and de-randomizing circuit configured to first randomize data to be programmed to the memory cell, based on a seed value; a data reading/writing circuit configured to second randomize first randomized data using a data inverting operation and program second randomized data to the memory cell; and a control logic configured to control the randomizing and de-randomizing circuit and the data reading/writing circuit.

In an embodiment of the present invention, an operating method of a nonvolatile memory device includes: receiving an address and data to be programmed to a memory cell corresponding to the address; generating a random value based on the address as a seed value; logically mixing the random value and the data to be programmed and generating first randomized data; and generating second randomized data by inverting the first randomized data.

In an embodiment of the present invention, an operating method of a nonvolatile memory device includes: reading data from a memory cell corresponding to a received address; generating first de-randomized data by inverting read data; generating a random value based on the address as a seed value; and logically mixing the random value and the first de-randomized data and generating second de-randomized data.

In an embodiment of the present invention, a data storage apparatus includes: a nonvolatile memory device; and a controller configured to control the nonvolatile memory device, wherein the nonvolatile memory device comprising a memory cell disposed at a region where a word line and a bit line cross with each other; a randomizing and de-randomizing circuit configured to first randomize data to be programmed to the memory cell, based on a seed value; a data reading/writing circuit configured to second randomize first randomized data using a data inverting operation and program second randomized data to the memory cell; and a control logic configured to control the randomizing and de-randomizing circuit and the data reading/writing circuit.

BRIEF DESCRIPTION OF THE DRAWINGS

Features, aspects, and embodiments are described in conjunction with the attached drawings, in which:

FIG. 4 is a view explaining the randomizing operation of the data reading/writing circuit shown in FIG. 1;

DETAILED DESCRIPTION

Figure 1:
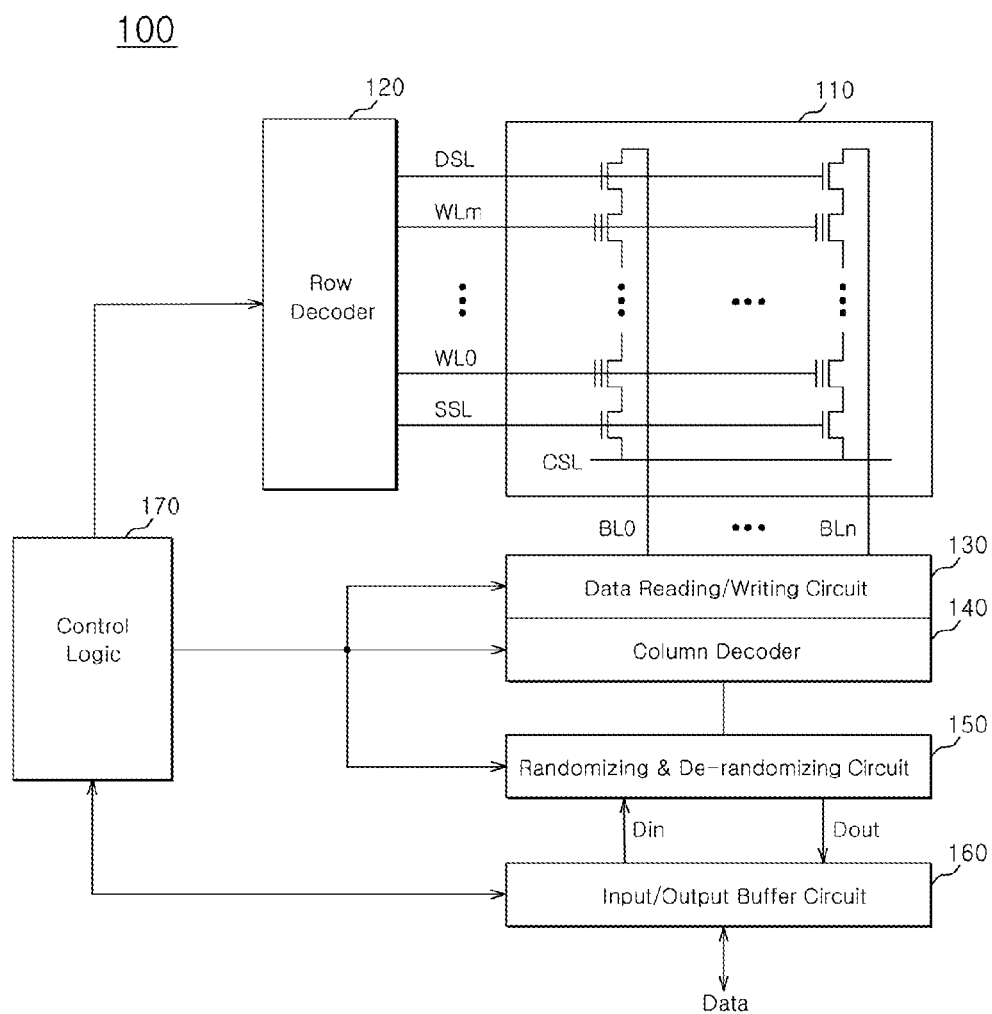
FIG. 1 is a block diagram exemplarily showing a semiconductor memory device in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, integer, step, operation, element, and/or component, but do not preclude the presence or addition of one or more other features, integers, steps, operations, elements, components, and/or groups thereof.

Hereinafter, a semiconductor memory device, an operating method thereof, and a data storage apparatus including the same according to the present invention will be described below with reference to the accompanying drawings through exemplary embodiments.

FIG. 1 is a block diagram exemplarily showing a semiconductor memory device in accordance with an embodiment of the present invention. Referring to FIG. 1, a NAND flash memory device is used as an example for explaining the characteristics and functions of an embodiment of the present invention. However, it is to be noted that the characteristics and functions of various embodiments of the present invention described below are not limited to a specific type of a semiconductor memory device. That is, a semiconductor memory device and a data randomizing method thereof which will be described below may be applied to nonvolatile memory devices such as a NAND flash memory device, a NOR flash memory device, a PRAM (phase change RAM), an FRAM (ferroelectric RAM) and an MRAM (magnetic RAM), and may be applied to various types of flash memory devices regardless of the structures of charge storing layers of the flash memory devices.

Referring to FIG. 1, a semiconductor memory device 100 includes a memory cell array 110, a row decoder 120, a data reading/writing circuit 130, a column decoder 140, a randomizing and de-randomizing circuit 150, an input/output buffer circuit 160, and a control logic 170.

The memory cell array 110 includes a plurality of memory cells arranged at crossing regions of bit lines BL0 to BLn and word lines WL0 to WLm. Each memory cell may store 1-bit data. Such a memory cell is referred to as a single level cell (SLC). The single level cell (SLC) is programmed to have a threshold voltage corresponding to any one of an erased state and a programmed state. In another example, each memory cell may store 2 or more-bit data. Such a memory cell is referred to as a multi-level cell (MLC). The multi-level cell (MLC) is programmed to have a threshold voltage corresponding to any one of an erased state and a plurality of programmed states according to multi-bit data. The memory cell array 110 may be realized to have a single-layer array structure (referred to as a two-dimensional array structure) or a multi-layer array structure (referred to as a three-dimensional array structure).

The row decoder 120 operates under the control of the control logic 170. The row decoder 120 is configured to perform a selecting operation and a driving operation for the rows of the memory cell array 110 in response to row addresses. For example, the row decoder 120 is configured to respectively transfer various word line voltages provided from a voltage generator (not shown), to selected word lines and unselected word lines.

The data reading/writing circuit 130 operates under the control of the control logic 170. The data reading/writing circuit 130 is configured to operate as a write driver or a sense amplifier depending upon an operation mode. Further, the data reading/writing circuit 130 is configured to randomize data to be programmed to a memory cell or de-randomize data read from a memory cell, through a data inverting operation.

For example, in a program operation, the data reading/writing circuit 130 inverts first randomized data provided from the randomizing and de-randomizing circuit 150 and generates second randomized data. The data reading/writing circuit 130 stores the second randomized data to a memory cell of the memory cell array 110. In another example, in a read operation, the data reading/writing circuit 130 inverts the data read from a memory cell of the memory cell array 110 and generates first de-randomized data. The data reading/writing circuit 130 provides the first de-randomized data to the randomizing and de-randomizing circuit 150.

The data reading/writing circuit 130 includes a plurality of data reading/writing circuits which respectively correspond to the bit lines BL0 to BLn (or bit line pairs). For this reason, the bit lines BL0 to BLn (or bit line pairs) are selected or controlled by the respective data reading/writing circuits.

The column decoder 140 operates under the control of the control logic 170. The column decoder 140 is configured to sequentially select the bit lines BL0 to BLn (or the data reading/writing circuits) by a predetermined unit in response to column addresses in the read operation or the program operation.

The randomizing and de-randomizing circuit 150 operates under the control of the control logic 170. The randomizing and de-randomizing circuit 150 is configured to perform a first randomizing operation on the data provided through the input/output buffer circuit 160 (that is, data to be programmed). Further, the randomizing and de-randomizing circuit 150 is configured to perform a second de-randomizing operation on the first de-randomized data provided from the data reading/writing circuit 130. The randomizing and de-randomizing circuit 150 in accordance with an embodiment of the present invention performs a first randomizing operation such that randomizing of the data to be programmed is implemented in a column direction (or a memory cell string direction). Further, the randomizing and de-randomizing circuit 150 performs a second de-randomizing operation such that de-randomizing of the first de-randomized data is implemented in the column direction (or the memory cell string direction). This will be described later in detail.

The input/output buffer circuit 160 is configured to receive a command and an address from an external device (for example, a memory controller, a memory interface, a host, etc.) and provide the inputted command and address to the control logic 170. The input/output buffer circuit 160 is configured to receive data from an external device and provide the inputted data to the randomizing and de-randomizing circuit 150. The input/output buffer circuit 160 is configured to output the de-randomized data provided from the randomizing and de-randomizing circuit 150 (that is, the data recovered to original data) to the external device.

The control logic 170 is configured to control the general operations of the semiconductor memory device 100 in response to control signals provided from the external device. For example, the control logic 170 controls the read, program (or write) and erase operations of the semiconductor memory device 100. In another example, the control logic 170 controls the randomizing operation for the data to be programmed and the de-randomizing operation for the data read from the memory cell. This means that the randomizing operation for the data to be programmed and the de-randomizing operation for the read data are performed not outside the semiconductor memory device 100 but inside the semiconductor memory device 100.

According to an embodiment of the present invention, a first randomizing operation is performed on the data to be programmed in the memory cell by the randomizing and de-randomizing circuit 150, and first randomized data are obtained. The first randomizing operation may be performed using a random value (RV). A second randomizing operation is performed on the first randomized data by the data reading/writing circuit 130. The second randomizing operation may be performed through a data inverting operation. Conversely, a first de-randomizing operation is performed on the randomized data read from the memory cell by the data reading/writing circuit 130. The first de-randomizing operation may be performed through a data inverting operation. A second de-randomizing operation is performed on the first de-randomized data by the randomizing and de-randomizing circuit 150. The second de-randomizing operation may be performed using a random value (RV). The randomizing operation and the de-randomizing operation in accordance with an embodiment of the present invention will be described in detail with reference to FIGS. 3 to 8.

In accordance with an embodiment of the present invention, changes in the threshold voltages of memory cells which are caused due to program disturbance or coupling are relatively alleviated when compared to before the data randomizing. That is, changes in the threshold voltages of memory cells are suppressed. This means that a reading margin is improved and thus the reliability of a semiconductor memory device is improved.

Figure 2:
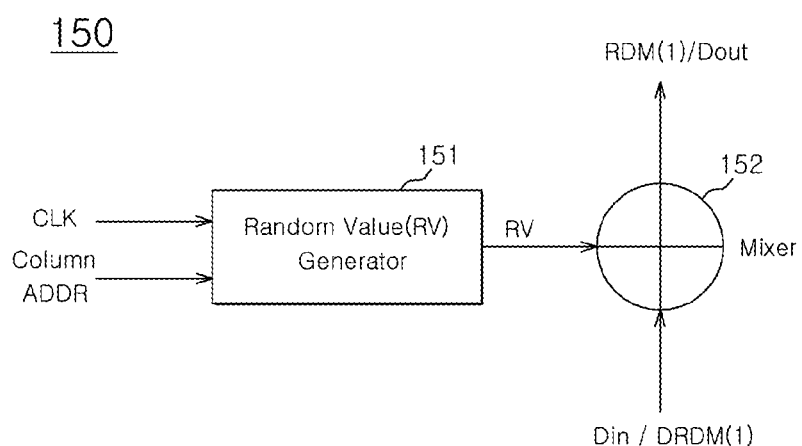
FIG. 2 is a block diagram exemplarily showing the randomizing and de-randomizing circuit shown in FIG. 1.

FIG. 2 is a block diagram exemplarily showing the randomizing and de-randomizing circuit shown in FIG. 1. As described above with reference to FIG. 1, the randomizing and de-randomizing circuit 150 is configured to perform the first randomizing operation on the data provided through the input/output buffer circuit 160 (that is, the data to be programmed). Further, the randomizing and de-randomizing circuit 150 is configured to perform the second de-randomizing operation on the first de-randomized data provided from the data reading/writing circuit 130.

Referring to FIG. 2, the randomizing and de-randomizing circuit 150 includes a random value generator 151 and a mixer 152. The random value generator 151 in accordance with an embodiment of the present invention includes a linear feedback shift register (LFSR). The mixer 152 includes a logic circuit capable of performing a logic operation. For example, the mixer 152 includes a logic circuit capable of performing an XOR operation, that is, an XOR unit.

The random value generator 151 is configured to sequentially generate a random value (RV) according to toggling of a clock signal CLK provided from the control logic 170. The random value generator 151 is configured to generate the random value (RV) based on a seed value. For instance, as the seed value of the random value generator 151, a column address provided in the program operation or a column address provided in the read operation is used. The random value (RV) generated by the random value generator 151 is provided to the mixer 152.

The mixer 152 is configured to logically mix data Din inputted in the program operation and the random value (RV) through the XOR operation. The mixer 152 outputs the mixed data, that is, first randomized data RDM(1), to the column decoder 140. The mixer 152 is configured to logically mix the data inputted from the column decoder 140 in the read operation, for example, first de-randomized data DRDM(1), and the random value (RV) through the XOR operation. The mixer 152 outputs the mixed data, for example, second de-randomized data, to the input/output buffer circuit 160. Here, the second de-randomized data is data Dout which is recovered to original data.

Figure 3:
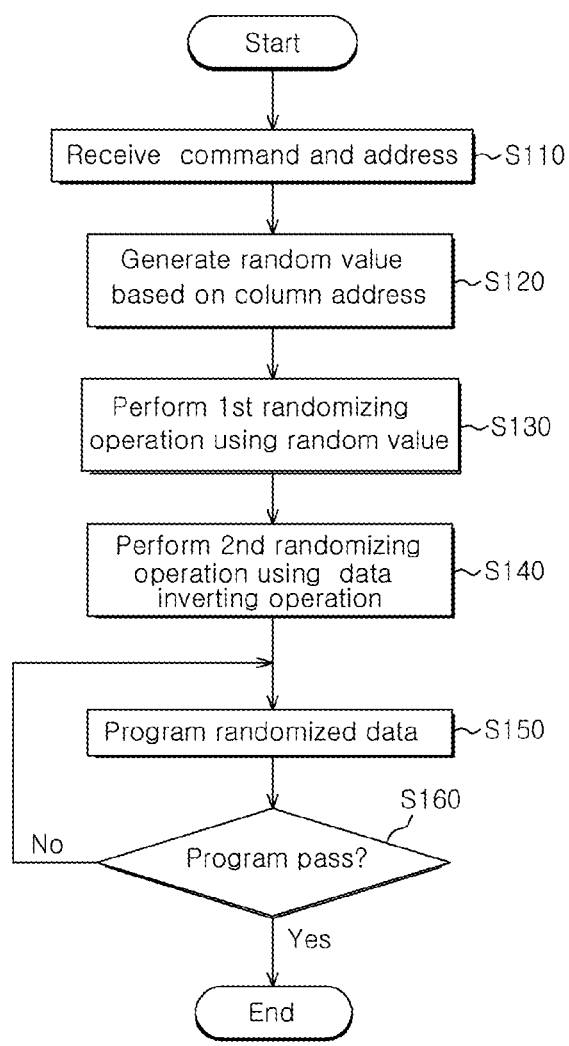
FIG. 3 is a flow chart explaining the program operation of the semiconductor memory device in accordance with an embodiment of the present invention.

FIG. 3 is a flow chart explaining the program operation of the semiconductor memory device in accordance with an embodiment of the present invention. FIG. 4 is a view explaining the randomizing operation of the data reading/writing circuit shown in FIG. 1. The program operation of the semiconductor memory device 100 in accordance with an embodiment of the present invention will be described in detail with reference to FIGS. 1 to 4.

If a program command is provided from an external device (for example, a memory controller, a memory interface, a host, etc.), the program operation of the semiconductor memory device 100 is started. In step S110, an address is provided to the semiconductor memory device 100 along with the program command. The address includes a column address and a row address of the memory cell array 110. The row address includes a block address for selecting a memory block and a page address for selecting a page of the memory block.

In step S120, as the address is provided to the semiconductor memory device 100, the randomizing and de-randomizing circuit 150 generates a random value (RV) under the control of the control logic 170. The column address is provided to the randomizing and de-randomizing circuit 150 as a seed value. In other words, the randomizing and de-randomizing circuit 150 generates the random value (RV) based on the column address. The randomizing and de-randomizing circuit 150 sequentially generates the random value (RV) according to toggling of the clock signal CLK provided from the control logic 170. According to an example, the clock signal CLK toggles in response to a control signal for controlling the program operation of the semiconductor memory device 100 (for example, a write enable signal (/WE)).

In step S130, the randomizing and de-randomizing circuit 150 performs a first randomizing operation using the generated random value (RV). In detail, data to be programmed is provided to the mixer 152 through the input/output buffer circuit 160. For example, the generated random value (RV) is provided to the mixer 152. The mixer 152 mixes the data to be programmed and the random value (RV) through the XOR operation. As a result, the first randomized data is generated. The first randomizing operation is performed in a column direction (i.e., a memory cell string direction). The first randomized data is loaded on the data reading/writing circuit 130 through the column decoder 140. The first randomizing operation is performed until, for example, all data to be programmed are loaded on the data reading/writing circuit 130.

In step S140, if all the data to be programmed are loaded on the data reading/writing circuit 130, the data reading/writing circuit 130 performs a second randomizing operation using a data inverting operation. The second randomizing operation will be described in detail below.

Referring to FIG. 4, it is assumed that first randomized data RDM(1) are loaded on the data reading/writing circuit 130 in the sequence of "ABh, CAh, . . . ". The data reading/writing circuit 130 inverts specified bits of respective loaded first randomized data RDM(1). In FIG. 4, it is exemplified that the first bits b0 of the first randomized data RDM(1) are inverted. A second randomizing operation is performed on the first randomized data "ABh, CAh, . . . " and the first randomized data "ABh, CAh, . . . " change into second randomized data "AAh, CBh, . . . " through the second randomizing operation using the data inverting operation.

The data inverting operation performed by the data reading/writing circuit 130 as the second randomizing operation is not limited to the method shown in FIG. 4. For example, one or more bits may be inverted through the data inverting operation.

In another example, one or more bit groups may be inverted through the data inverting operation. Here, bit groups mean groups of specified bits. For example, a first bit b0 and a fifth bit b4 may be grouped into a first bit group, a second bit b1 and a sixth bit b5 may be grouped into a second bit group, a third bit b2 and a seventh bit b6 may be grouped into a third bit group, and a fourth bit b3 and an eighth bit b7 may be grouped into a fourth bit group. One or more bit groups may be inverted through the data inverting operation.

In still another example, different bits of different pages of the memory cell array 110 may be inverted through the data inverting operation. In this case, bits to be inverted may be repeated according to the bit number of data. It is assumed that data is 8-bit data, that is, 1 byte data. Under this assumption, a first bit b0 may be inverted in data to be stored in a first page, a second bit b1 may be inverted in data to be stored in a second page, a third bit b2 may be inverted in data to be stored in a third page, a fourth bit b3 may be inverted in data to be stored in a fourth page, a fifth bit b4 may be inverted in data to be stored in a fifth page, a sixth bit b5 may be inverted in data to be stored in a sixth page, a seventh bit b6 may be inverted in data to be stored in a seventh page, and an eighth bit b7 may be inverted in data to be stored in an eighth page. Further, the first bit b0 may be inverted again in data to be stored in a ninth page, the second bit b1 may be inverted again in data to be stored in a tenth page, and the third bit b2 may be inverted again in data to be stored in an eleventh page. In this way, bit inversion may be repeated in data to be stored in subsequent pages.

Referring to FIG. 3 again, in step S150, the second randomized data are programmed to memory cells which belong to a selected page. In step S160, it is checked whether or not the memory cells belonging to the selected page are programmed to have desired states (e.g., threshold voltages), that is, it is checked whether or not programming operations of the memory cells belonging to the selected page have been completed. In the case where programming operations of the memory cells belonging to the selected page have not been completed, the step S150 is performed again. On the contrary, in the case where programming operations of the memory cells belonging to the selected page have been completed, the program operation is ended.

As described above, the data to be programmed is randomized through the first randomizing operation using the random value (RV). The first randomized data is randomized again through the second randomizing operation using the data inverting operation. Accordingly, the states of the memory cells may be uniformly distributed. This means that data patterns may be formed the same with or similar to one another in the column direction or the row direction of the memory cell array 110. For this reason, the reliability of the semiconductor memory device 100 may be improved.

Figure 5:
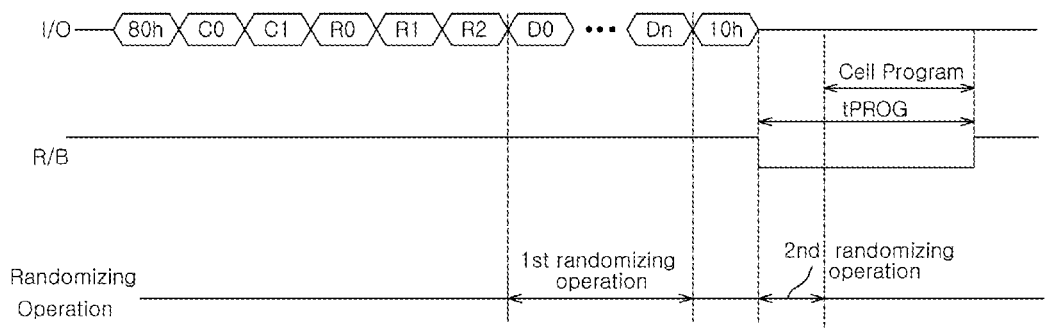
FIG. 5 is a timing diagram explaining the program operation of the semiconductor memory device in accordance with an embodiment of the present invention.
Figure 6:
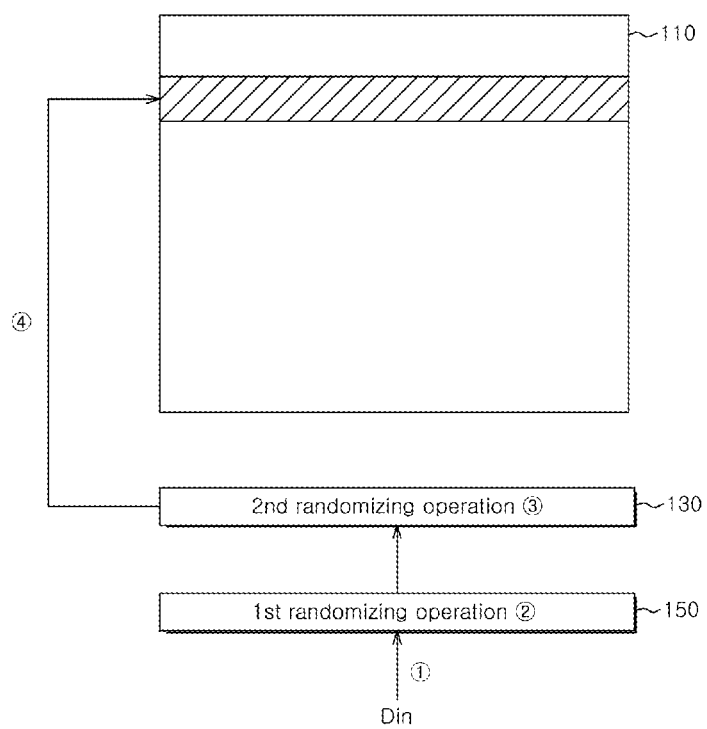
FIG. 6 is a diagram showing data flow during the program operation of the semiconductor memory device in accordance with an embodiment of the present invention.

FIG. 5 is a timing diagram explaining the program operation of the semiconductor memory device in accordance with an embodiment of the present invention. FIG. 6 is a diagram showing data flow during the program operation of the semiconductor memory device in accordance with an embodiment of the present invention. Referring to FIGS. 1, 5 and 6, the program operation of the semiconductor memory device 100 in accordance with an embodiment of the present invention will be described in detail.

The program operation is performed with the input of a series of commands, addresses and data. For example, as shown in FIG. 5, a first command 80h, addresses C0, C1, R0, R1 and R2, data D0 to Dn, and a second command 10h are sequentially provided to the semiconductor memory device 100. The addresses C0, C1, R0, R1 and R2 include column addresses C0 and C1 and row addresses R0, R1 and R2.

The data to be programmed are sequentially provided to the randomizing and de-randomizing circuit 150 through the input/output buffer circuit 160 according to toggling of a control signal (for example, a write enable signal (/WE)) provided for programming data (see ① in FIG. 6).

The randomizing and de-randomizing circuit 150 generates a random value (RV) in response to a column address and the clock signal CLK toggling in correspondence to the write enable signal /WE. The randomizing and de-randomizing circuit 150 performs the first randomizing operation using the random value (RV) which is generated while the data are inputted (see ② in FIG. 6). The first randomizing operation is performed until all data to be programmed are provided to the data reading/writing circuit 130.

If all the data randomized through the first randomizing operation are loaded on the data reading/writing circuit 130, a program checking command, for example, the second command 10h is provided to the semiconductor memory device 100. At this time, as shown in FIG. 5, a ready/busy signal R/B of the semiconductor memory device 100 transitions from a high level to a low level. The data reading/writing circuit 130 performs the second randomizing operation for the loaded data (that is, the first randomized data) using the data inverting operation during the low level duration of the ready/busy signal R/B, that is, during a program time tPROG (see ③ in FIG. 6). The data reading/writing circuit 130 programs the data second randomized during the program time tPROG, to the memory cells which belong to the selected page (see ④ in FIG. 6).

Figure 7:
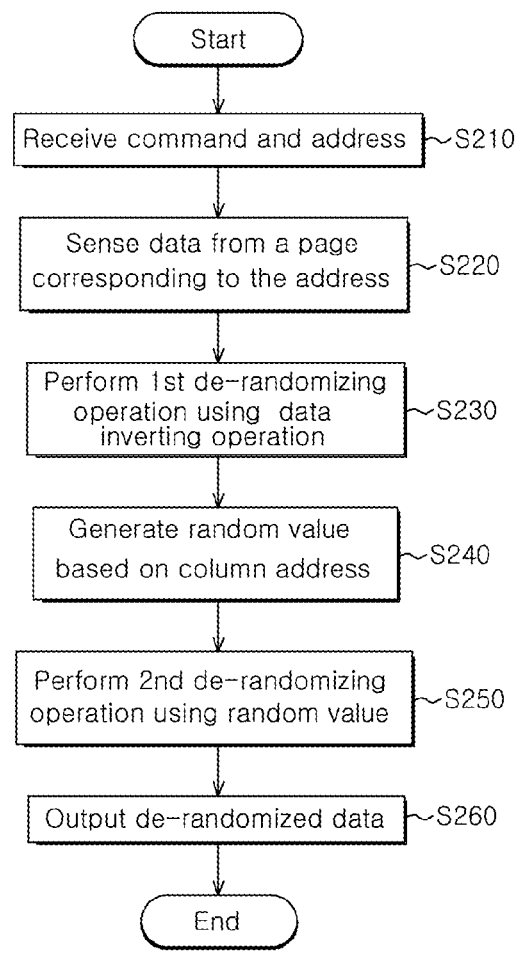
FIG. 7 is a flow chart explaining the read operation of the semiconductor memory device in accordance with an embodiment of the present invention.

FIG. 7 is a flow chart explaining the read operation of the semiconductor memory device in accordance with an embodiment of the present invention. Referring to FIGS. 1, 2 and 7, the read operation of the semiconductor memory device 100 in accordance with an embodiment of the present invention will be described in detail.

If a read command is provided from an external device (for example, a memory controller, a memory interface, a host, etc.), the read operation of the semiconductor memory device 100 is started. In step S210, an address is provided to the semiconductor memory device 100 along with the read command. The address includes a column address and a row address of the memory cell array 110. The row address includes a block address for selecting a memory block and a page address for selecting a page of the memory block.

In step S220, data is sensed from a page corresponding to the provided address, by the data reading/writing circuit 130. The data reading/writing circuit 130 reads the data stored in the memory cells corresponding to the selected page, under the control of the control logic 170. The read data are second randomized data.

In step S230, the data reading/writing circuit 130 performs the first de-randomizing operation using the data inverting operation. According to an embodiment of the present invention, the data inverting operation used in the first de-randomizing operation is the same as the data inverting operation used in the second randomizing operation (described above with reference to FIG. 3). Thus, detailed description thereof will be omitted. The first de-randomized data generated through the first de-randomizing operation are provided to the randomizing and de-randomizing circuit 150 through the column decoder 140.

In step S240, the randomizing and de-randomizing circuit 150 generates a random value (RV) under the control of the control logic 170. A column address is provided to the randomizing and de-randomizing circuit 150 as a seed value. That is, the randomizing and de-randomizing circuit 150 generates the random value (RV) based on the column address. The randomizing and de-randomizing circuit 150 sequentially generates the random value (RV) in response to toggling clock signal CLK provided from the control logic 170. The clock signal CLK toggles in correspondence to a control signal (for example, a read enable signal (/RE)) provided for controlling the read operation of the semiconductor memory device 100. According to an embodiment of the present invention, the random value (RV) generated for the de-randomizing operation is the same as the random value (RV) generated for the randomizing operation.

In step S250, the randomizing and de-randomizing circuit 150 performs the second de-randomizing operation using the generated random value (RV). In detail, the first de-randomized data is provided to the mixer 152 through the column decoder 140. At this time, the generated random value (RV) is provided to the mixer 152. The mixer 152 mixes the first de-randomized data and the random value (RV) through the XOR operation. As a result, second de-randomized data are generated. The second de-randomizing operation is performed in the column direction (or the memory cell string direction).

In step S260, the second de-randomized data, that is, the data recovered to original data, are outputted to the external device.

Figure 8:
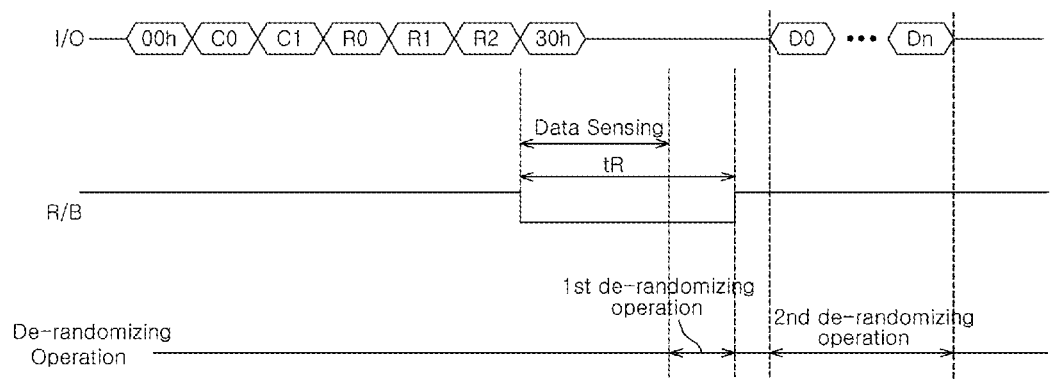
FIG. 8 is a timing diagram explaining the read operation of the semiconductor memory device in accordance with an embodiment of the present invention.
Figure 9:
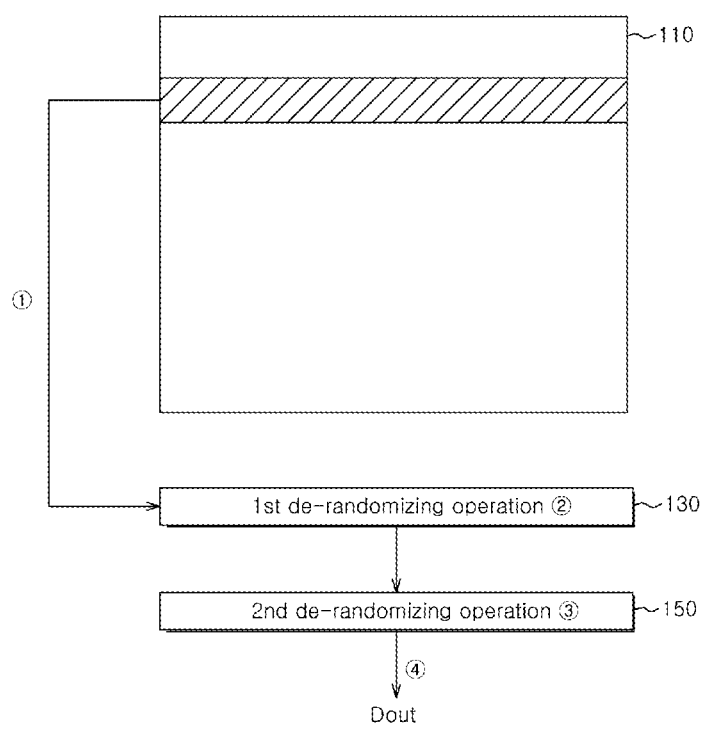
FIG. 9 is a diagram showing data flow during the read operation of the semiconductor memory device in accordance with an embodiment of the present invention.

FIG. 8 is a timing diagram explaining the read operation of the semiconductor memory device in accordance with an embodiment of the present invention. FIG. 9 is a diagram showing data flow during the read operation of the semiconductor memory device in accordance with an embodiment of the present invention. Referring to FIGS. 1, 8 and 9, the read operation of the semiconductor memory device 100 in accordance with an embodiment of the present invention will be described in detail.

The read operation is performed with the input of a series of commands and addresses. For example, as shown in FIG. 8, a first command 00h, addresses C0, C1, R0, R1 and R2 and a second command 30h are sequentially provided to the semiconductor memory device 100. The addresses C0, C1, R0, R1 and R2 include column addresses C0 and C1 and row addresses R0, R1 and R2.

If a read checking command, that is, the second command 30h is provided to the semiconductor memory device 100, as shown in FIG. 8, a ready/busy signal R/B of the semiconductor memory device 100 transitions from a high level to a low level. The data reading/writing circuit 130 reads data from the memory cells which belong to the selected page, during the low level duration of the ready/busy signal R/B, that is, during a read time tR (see ① in FIG. 9).

The data reading/writing circuit 130 performs the first de-randomizing operation for the data read from the memory cells during the read time tR (that is, the second randomized data) (see ② in FIG. 9). The first de-randomized data obtained through the first de-randomizing operation are provided to the randomizing and de-randomizing circuit 150. The randomizing and de-randomizing circuit 150 generates the random value (RV) in response to the clock signal CLK which toggles in correspondence to the control signal provided for reading data (for example, the read enable signal (/RE)). Further, the randomizing and de-randomizing circuit 150 performs the second de-randomizing operation using the generated random value (RV) (see ③ in FIG. 9). The second de-randomizing operation is performed until all access-requested data are outputted.

The second de-randomized data, that is, data Dout recovered to original data are sequentially provided to the external device through the input/output buffer circuit 160 according to toggling of the read enable signal (/RE) (see ④ in FIG. 9).

Figure 10:
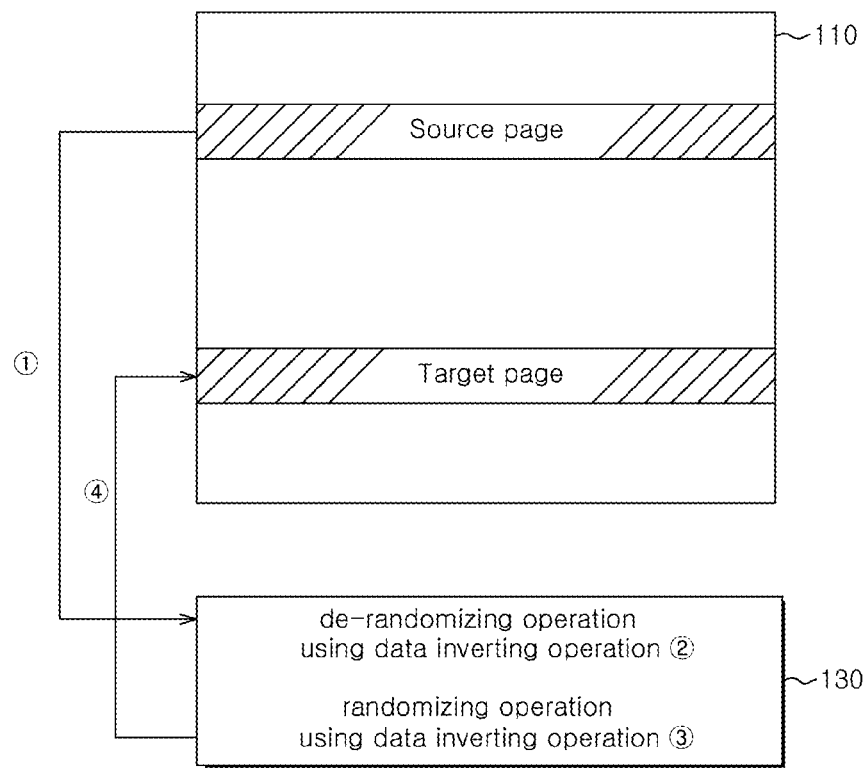
FIG. 10 is a diagram showing data flow during the copyback program operation of the semiconductor memory device in accordance with an embodiment of the present invention.

FIG. 10 is a diagram showing data flow during the copy-back program operation of the semiconductor memory device in accordance with an embodiment of the present invention. The copy-back program operation of a semiconductor memory device includes a read operation for reading data from a source page and a program operation for programming read data to a target page. Referring to FIGS. 1 and 10, the copy-back program operation of the semiconductor memory device 100 in accordance with an embodiment of the present invention will be described in detail.

If the copy-back program operation is started, the data reading/writing circuit 130 reads data from memory cells which belong to a source page of the memory cell array 110, under the control of the control logic 170 (see ① in FIG. 10). Here, the read data are second randomized data.

The data reading/writing circuit 130 performs a de-randomizing operation for the data read from the memory cells (that is, the second randomized data) using a data inverting operation during a read time tR (see ② in FIG. 10). The read data are recovered to first randomized data through the de-randomizing operation using the data inverting operation.

The data reading/writing circuit 130 performs a randomizing operation for de-randomized data (that is, first randomized data) using a data inverting operation during a program time tPROG (see ③ in FIG. 10). The de-randomized data (that is, the first randomized data) are randomized and change into second randomized data through the randomizing operation using the data inverting operation. The data reading/writing circuit 130 programs the second randomized data to memory cells which belong to a target page, during the program time tPROG (see ④ in FIG. 10).

According to the copy-back program operation in accordance with an embodiment of the present invention, even when data are stored, through a copy-back operation, in a page different from a page in which they are originally stored, they can be recovered to original data through a first de-randomizing operation using a data inverting operation and a second de-randomizing operation using a random value. In other words, due to the fact that a page address is not used in a randomizing operation and a de-randomizing operation, even when data are stored in a page different from a page in which they are originally stored, they can be recovered to original data through the copy-back program operation.

Figure 11:
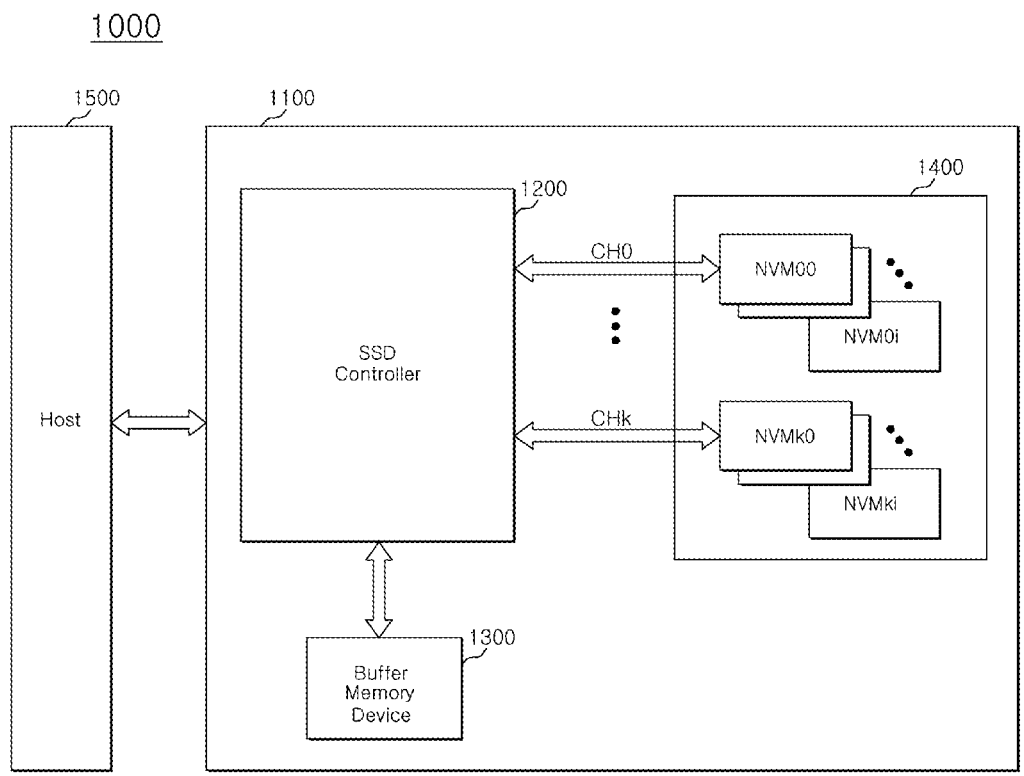
FIG. 11 is a block diagram exemplarily showing a data processing system including the semiconductor memory device in accordance with an embodiment of the present invention.

FIG. 11 is a block diagram exemplarily showing a data processing system including the semiconductor memory device in accordance with an embodiment of the present invention. Referring to FIG. 11, a data processing system 1000 includes a data storage apparatus 1100 and a host 1500. The data storage apparatus 1100 may comprise a solid state drive (SSD).

The SSD 1100 includes an SSD controller 1200, a buffer memory device 1300, and a data storage medium 1400. The SSD 1100 may further include a temporary power circuit including super capacitors. Such a temporary power circuit may supply power when a sudden power-off occurs so that the SSD 1100 may be normally ended.

The SSD 1100 operates in response to an access request from the host 1500. The SSD controller 1200 is configured to access the data storage medium 1400 in response to a request from the host 1500. For example, the SSD controller 1200 is configured to control read, program and erase operations for the data storage medium 1400.

The buffer memory device 1300 is configured to temporarily store data which are to be stored in the data storage medium 1400. Also, the buffer memory device 1300 is configured to temporarily store data which are read from the data storage medium 1400. The data stored in the buffer memory device 1300 are transmitted to the data storage medium 1400 or the host 1500 under the control of the SSD controller 1200.

The SSD controller 1200 is connected with the data storage medium 1400 through a plurality of channels CH0 to CHk. A plurality of semiconductor memory devices NVM00 to NVM0i and NVMk0 to NVMki are connected to the respective channels CH0 to CHk. The data storage medium 1400 may comprise the semiconductor memory device 100 in accordance with an embodiment of the present invention. Accordingly, the data reliability of the SSD 1100 may be improved.

Figure 12:
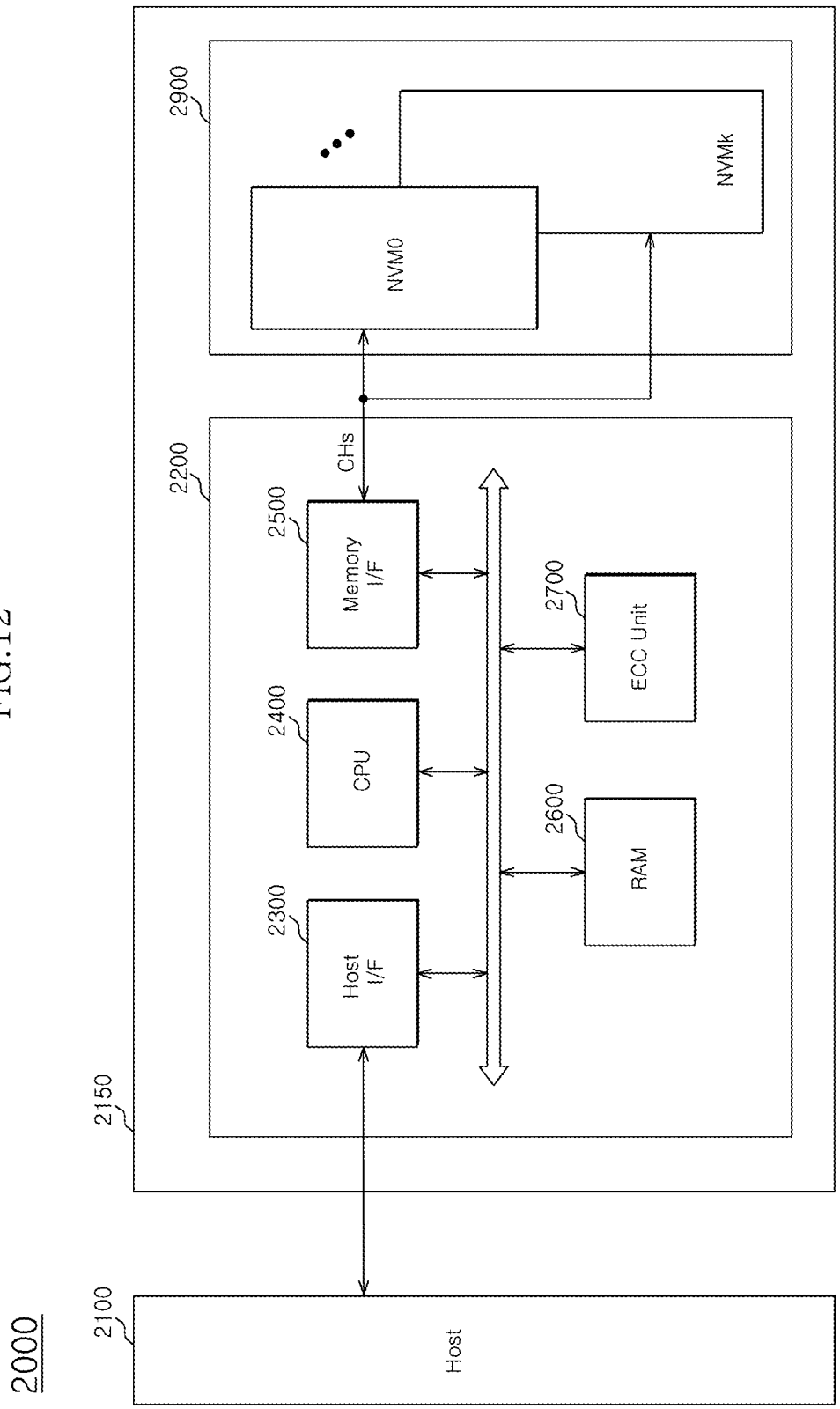
FIG. 12 is a block diagram exemplarily showing another data processing system including the semiconductor memory device in accordance with an embodiment of the present invention.

FIG. 12 is a block diagram exemplarily showing another data processing system including the semiconductor memory device in accordance with an embodiment of the present invention. Referring to FIG. 12, a data processing system 200 includes a host 2100 and a data storage apparatus 2150. The data storage apparatus 2150 includes a controller 2200 and a data storage medium 2900.

The controller 2200 is connected to the host 2100 and the data storage medium 2900. The controller 2200 is configured to access the data storage medium 2900 in response to a request from the host 2100. For example, the controller 2200 is configured to control the read, program or erase operation of the data storage medium 2900. The controller 2200 is configured to drive a firmware for controlling the data storage medium 2900.

The controller 2200 may include well-known components such as a host interface 2300, a central processing unit 2400, a memory interface 2500, a RAM 2600, and an error correction code unit 2700.

The central processing unit 2400 controls the general operations of the controller 2200. The RAM 2600 may be used as a working memory of the central processing unit 2400.

The host interface 2300 is configured to interface the host 2100 and the controller 2200. For example, the host interface 2300 may be configured to communicate with the host 2100 through one of various interface protocols such as a USB (universal serial bus) protocol, an MMC (multimedia card) protocol, a PCI (peripheral component interconnection) protocol, a PCI-E (PCI-express) protocol, a PATA (parallel advanced technology attachment) protocol, a SATA (serial ATA) protocol, a SCSI (small computer small interface) protocol, and an IDE (integrated drive electronics) protocol.

The memory interface 2500 is configured to interface the controller 2200 and the data storage medium 2900. The data storage medium 2900 may comprise the semiconductor memory device 100 in accordance with an embodiment of the present invention. Thus, the data reliability of the data storage apparatus 2150 may be improved.

The error correction code unit 2700 may be configured to detect and correct an error of the data read from the data storage medium 2900.

The controller 2200 and the data storage medium 2900 may be integrated into one semiconductor apparatus to constitute a memory card. For example, the controller 2200 and the data storage medium 2900 may be integrated into one semiconductor apparatus and may constitute a PCMCIA (personal computer memory card international association) card, a CF (compact flash) card, a smart media card, a memory stick, a multimedia card (MMC, RS-MMC and MMC-micro), an SD (secure digital) card (SD, Mini-SD and Micro-SD), a UFS (universal flash storage), etc.

In another example, the controller 2200 or the data storage medium 2900 may be mounted to various types of packages. For example, the controller 2200 or the data storage medium 2900 may be mounted by being packaged into various package types such as a POP (package on package), a ball grid array (BGA) package, a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a thin quad flat package (TQFP), a small outline IC (SOIC), a shrink small outline package (SSOP), a thin small outline package (TSOP), a thin quad flat package (TQFP), a system in package (SIP), a multi-chip package (MCP), a wafer-level fabricated package (WFP), and a wafer-level processed stack package (WSP).

Figure 13:
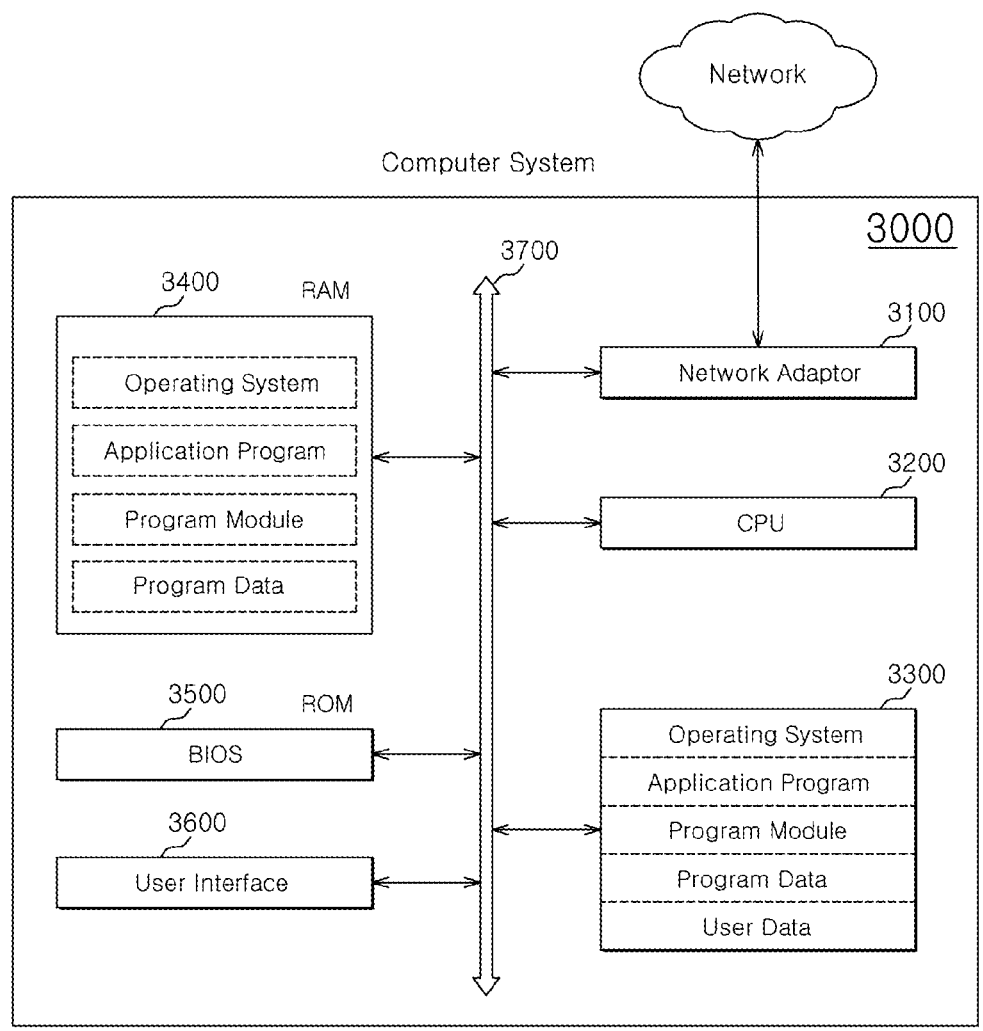
FIG. 13 is a block diagram exemplarily showing a computer system in which each of the data processing systems shown in FIGS. 11 and 12 is mounted.

FIG. 13 is a block diagram exemplarily showing a computer system in which each of the data processing systems shown in FIGS. 11 and 12 is mounted. Referring to FIG. 13, a computer system 3000 includes a network adaptor 3100, a central processing unit 3200, a data storage apparatus 3300, a RAM 3400, a ROM 3500 and a user interface, which are electrically connected to a system bus 3700. The data storage apparatus 3300 may comprise the data storage apparatus 1100 shown in FIG. 11. Otherwise, the data storage apparatus 3300 may be configured by the data storage apparatus 2150 shown in FIG. 12.

The network adaptor 3100 provides interfacing between the computer system 3000 and external networks. The central processing unit 3200 performs general operation processing for driving an operating system residing at the RAM 3400 or an application program.

The data storage apparatus 3300 stores general data necessary in the computer system 3000. For example, an operating system for driving the computer system 3000, an application program, various program modules, program data and user data are stored in the data storage apparatus 3300.

The RAM 3400 may be used as a working memory device of the computer system 3000. Upon booting, the operating system, the application program, the various program modules and the program data necessary for driving programs, which are read from the data storage apparatus 3300, are loaded on the RAM 3400. A BIOS (basic input/output system) which is activated before the operating system is driven is stored in the ROM 3500. Information exchange between the computer system 3000 and a user is implemented through the user interface 3600.

Besides, the computer system 3000 may further include a battery or a modem. Also, although not shown in a drawing, it is to be readily understood that an application chipset, a camera image processor (CIS), and the like may be further included in the computer system 3000.

As is apparent from the above description, according to the various embodiments of the present invention, the reliability of a semiconductor memory device may be improved through a data randomizing operation.

While certain embodiments have been described above, it will be understood to those skilled in the art that the embodiments described are by way of example only. Accordingly, the semiconductor memory device, the operating method thereof, and the data storage apparatus including the same described herein should not be limited based on the described embodiments. Rather, the semiconductor memory device, the operating method thereof, and the data storage apparatus including the same described herein should only be limited in light of the claims that follow when taken in conjunction with the above description and accompanying drawings.

What is claimed is:

1. A semiconductor memory device comprising:
a memory cell arranged at a region where a word line and a bit line cross each other;
a randomizing and de-randomizing circuit configured to perform a first randomizing operation on data to be programmed to the memory cell, based on a seed value, so as to generate first randomized data;
a data reading/writing circuit configured to perform a second randomizing operation on the first randomized data using a data inverting operation so as to generate second randomized data and program the second randomized data to the memory cell; and
a control logic configured to control the randomizing and de-randomizing circuit and the data reading/writing circuit.

2. The semiconductor memory device according to claim 1, wherein the data reading/writing circuit is configured to generate the second randomized data by inverting at least one bit of the first randomized data.

3. The semiconductor memory device according to claim 1, wherein the randomizing and de-randomizing circuit is configured to use a column address as the seed value.

4. The semiconductor memory device according to claim 3, wherein the randomizing and de-randomizing circuit comprises:
a random value generator configured to generate a random value based on the column address; and
a mixer configured to logically mix the random value and the data to be programmed.

5. The semiconductor memory device according to claim 4, wherein the mixer performs an XOR operation.

6. The semiconductor memory device according to claim 1, wherein the data reading/writing circuit is configured to read data stored in the memory cells and perform a first de-randomizing operation on the read data using a data inverting operation so as to generate first de-randomized data.

7. The semiconductor memory device according to claim 6, wherein the data reading/writing circuit is configured to generate the first de-randomized data by inverting at least one bit of the read data.

8. The semiconductor memory device according to claim 6, wherein the randomizing and de-randomizing circuit is configured to perform a second de-randomizing operation on the first de-randomized data based on a seed value.

9. The semiconductor memory device according to claim 8, wherein the randomizing and de-randomizing circuit is configured to use a column address as the seed value.

10. An operating method of a semiconductor memory device, comprising:
receiving an address and data to be programmed to a memory cell corresponding to the address;
generating a random value based on the address as a seed value;
logically mixing the random value and the data to be programmed and generating first randomized data; and
generating second randomized data by inverting the first randomized data.

11. The method according to claim 10,
wherein the address is divided into a column address and a row address, and
wherein the random value is generated by using the column address as the seed value.

12. The method according to claim 10, wherein the random value and the data to be programmed are mixed through an XOR operation.

13. The method according to claim 10, wherein the second randomized data is generated by inverting at least one bit of the first randomized data.

14. The method according to claim 10, further comprising:
programming the second randomized data to the memory cell.

15. An operating method of a semiconductor memory device, comprising:
reading data from a memory cell corresponding to a received address;
generating first de-randomized data by inverting read data;
generating a random value based on the address as a seed value; and logically mixing the random value and the first de-randomized data and generating second de-randomized data.

16. The method according to claim 15,
wherein the address is divided into a column address and a row address, and
wherein the random value is generated by using the column address as the seed value.

17. The method according to claim 15, wherein the random value and the first de-randomized data are mixed through an XOR operation.

18. The method according to claim 15, wherein the first de-randomized data is generated by inverting at least one bit of the read data.

19. The method according to claim 15, further comprising:
outputting the second de-randomized data to an external device.

20. A data storage apparatus comprising:
a semiconductor memory device; and
a controller configured to control the semiconductor memory device,
wherein the semiconductor memory device comprises:
a memory cell arranged at a region where a word line and a bit line cross each other;
a randomizing and de-randomizing circuit configured to perform a first randomizing operation on data to be programmed to the memory cells, based on a seed value, so as to generate first randomized data;
a data reading/writing circuit configured to perform a second randomizing operation on the first randomized data using a data inverting operation so as to generate second randomized data and program second randomized data to the memory cells; and
a control logic configured to control the randomizing and de-randomizing circuit and the data reading/writing circuit.

* * * * *